United States Patent [19]

Priel

[11] 3,980,898
[45] Sept. 14, 1976

[54] SENSE AMPLIFIER WITH TRI-STATE BUS LINE CAPABILITIES

[75] Inventor: Ury Priel, Cupertino, Calif.

[73] Assignee: National Semiconductor Corporation, Santa Clara, Calif.

[22] Filed: Mar. 12, 1975

[21] Appl. No.: 557,597

[52] U.S. Cl. .............................. 307/209; 307/208; 307/214; 307/237; 307/DIG. 1
[51] Int. Cl.$^2$ ................. H03K 19/08; H03K 19/38; H03K 19/40; H03K 5/08
[58] Field of Search ........... 307/209, 214, 215, 218, 307/DIG. 1, 208, 270, 237

[56] References Cited
UNITED STATES PATENTS

| | | | |
|---|---|---|---|
| 3,602,733 | 8/1971 | Aoki | 307/209 |
| 3,736,572 | 5/1973 | Tu | 307/215 X |
| 3,743,855 | 7/1973 | Struger | 307/214 X |
| 3,792,292 | 2/1974 | Priel | 307/209 |

OTHER PUBLICATIONS
Femling, "Tri-State Logic in Modular Systems"; National Semiconductor Corp. (publication); 15 pgs.; 4/1971.

Primary Examiner—John S. Heyman
Assistant Examiner—L. N. Anagnos
Attorney, Agent, or Firm—Lowhurst & Aine

[57] ABSTRACT

A novel sense amplifier circuit providing conversion of MOS input signals to TTL output signals with tri-state logic output at the output data bus, the input circuit of the sense amplifier providing current sensing and programmable input thresholds for economical construction and enhanced speed of operation of the sense amplifier. A novel tri-state operation is provided for the input section of the sense amplifier to provide either a clamped voltage at the input data bus line during MOS to TTL communication or a floating input when it is desired that MOS devices on the input data bus are to communicate.

16 Claims, 5 Drawing Figures

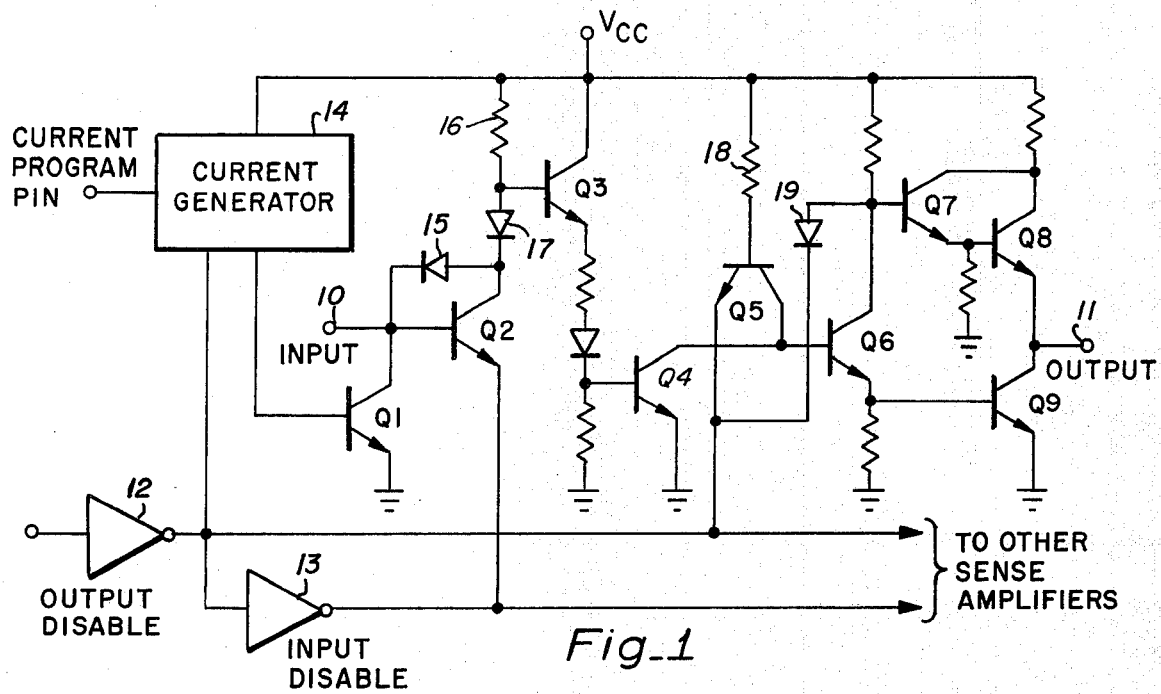
Fig_1
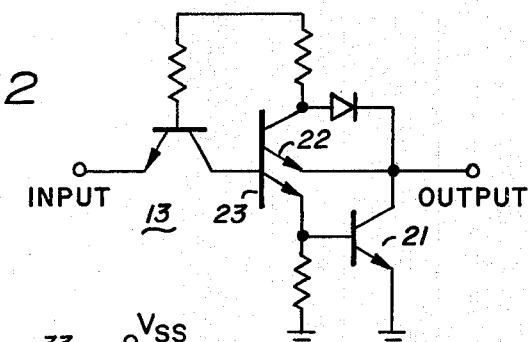
Fig_2
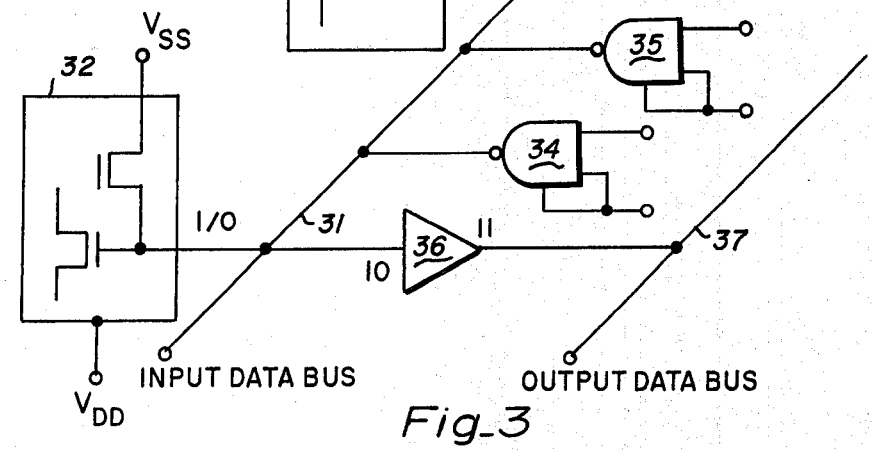
Fig_3

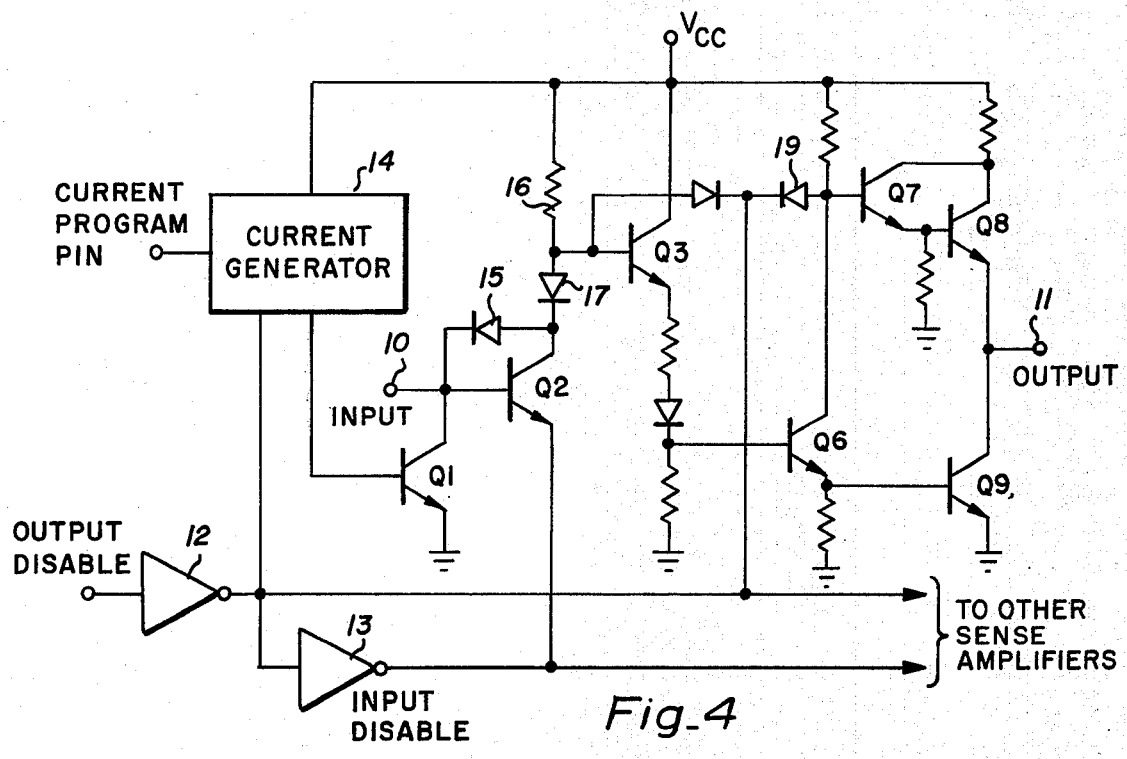
Fig_4
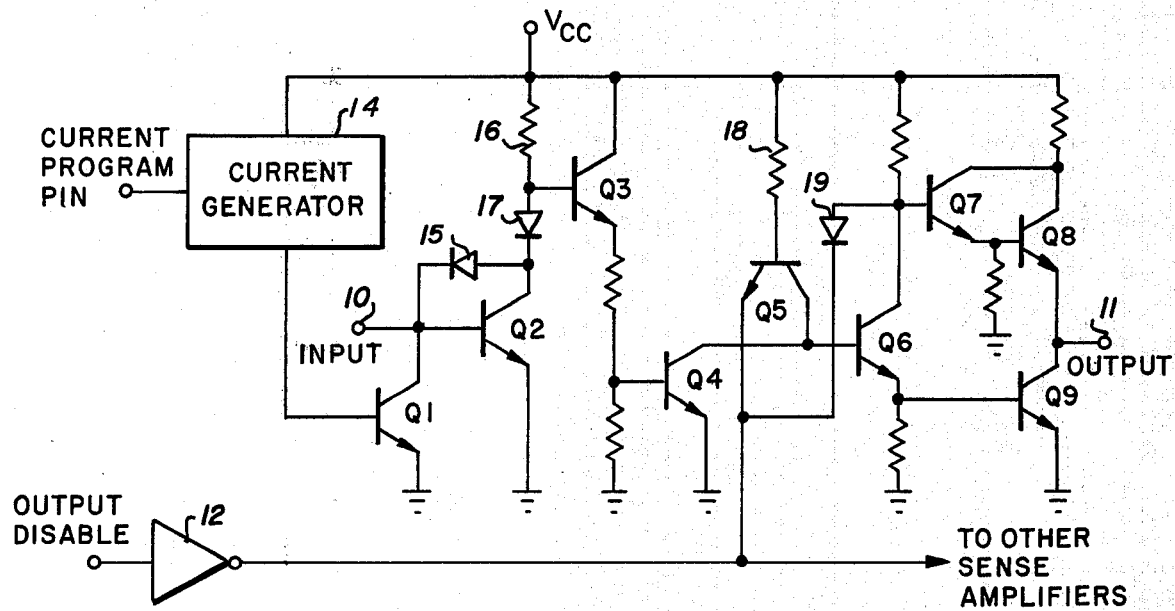
Fig_5

SENSE AMPLIFIER WITH TRI-STATE BUS LINE CAPABILITIES

BACKGROUND OF THE INVENTION

In the present state of the art, MOS devices are not compatible with and therefore cannot directly drive TTL buses because the output impedance of the MOS device is in general very high and it cannot drive the capacitive loads of TTL buses. It is necessary to use some elements as an interface between the MOS device and the TTL bus which will translate the high impedance of the MOS output signals to a low impedance drive for the TTL. Known prior art interface devices use voltage comparators which have high input impedances and, in order to enhance the speed of sensing as well as translating the current of the MOS device to a voltage, they require an input resistor, which is undesirable.

BRIEF SUMMARY OF THE PRESENT INVENTION

The present invention provides a novel MOS to TTL conversion sense amplifier providing a tri-state logic output and utilizing current sensing in the input stage to provide enhanced speed of operation. The MOS sense amplifier senses incoming signals from MOS devices and translates the sensed MOS signal an output suitable for TTL inputs and specifically inputs to TTL buses in a speedier and more economical fashion, with improved noise immunity. The novel sense amplifier offers current sensing and programmable input thresholds. In addition, the novel input circuit of the sense amplifier provides a tri-state input capability wherein the input data bus line can be clamped at a selected voltage while the MOS sense amplifier device coupled to the input data bus is communicating with TTL circuits on the output data bus. At times when it is desired that the MOS devices communicate with one another over the input data bus, the input to the sense amplifier can be made floating by use of an input disable gate in the sense amplifier, thus providing tri-state input capabilities.

BRIEF DESCRIPTION OF THE DRAWINGS

FIG. 1 is a schematic diagram of one embodiment of the present invention comprising an inverting sense amplifier incorporating both tri-state output and tri-state input capabilities.

FIG. 2 is a schematic diagram of one form of input disable gate used in the sense amplifier of FIG. 1.

FIG. 3 is a schematic diagram showing a sense amplifier of the type of FIG. 1 interconnected between an input data bus with MOS devices thereon and an output data bus.

FIG. 4 is a schematic diagram of a sense amplifier similar to that of FIG. 1 which is of the non-inverting type.

FIG. 5 is a schematic diagram of a sense amplifier similar to that of FIG. 1 with the tri-state input feature of the circuit omitted.

DESCRIPTION OF THE PREFERRED EMBODIMENTS

The present invention relates to tri-state logic circuitry, one example of such circuitry being found in U.S. Pat. 3,792,292 dated Feb. 12, 1974 in the name of Ury Priel and assigned to the assignee of this application. As with this prior system, the present invention comprises an input gate section, a buffer stage, an output sourcing switch, an output sinking switch, and an output disable gate, although the input gate section of the present system is significantly different than that of known prior art input sections.

Referring to FIG. 1, the input gate structure includes the transistors Q1 and Q2 coupled to the input terminal 10, the buffer stage comprises the transistors Q3 and Q4 and the output stage comprises transistors Q5 and Q6, the output sourcing switch including the transistor pair Q7 and Q8 coupled to the output terminal 11, the output sinking switch including the transistor Q9, and the output disable gate including the inverter circuit 12. There is an additional inverter gate 13 which forms the disable gate for the input circuit.

A current generator 14 supplies drive current to the base of transistor Q1 operating as a current sink which essentially will determine the threshold at which the input transistor Q2 will turn on. Transistor Q1 will demand a certain amount of current into its collector to reach this threshold. Until this threshold is reached, transistor Q2 is kept on by the feedback diode 15 since there is current flowing through resistor 16, diode 17, and diode 15 into the base of transistor Q2 coupled to the input terminal 10. At this point in time, the output of the input disable gate 13 is low or active, which is at a level of one $V_{BE}$ as will be described more fully below. Thus there is a path to ground for the emitter of transistor Q2 and the input gate is enabled.

Before any current is applied to the base of transistor Q2 from the input terminal 10, current flows through resistor 16, diode 17, diode 15 and into the base of transistor Q2. Some current flows into the collector of transistors Q1 and some flows into the collector of transistor Q2 and transistor Q2 is on. With transistor Q2 on, there is essentially a four diode drop on the base of transistor Q3, considering the $V_{BE}$ on the output of input disable gate 13, the $V_{BE}$ of transistor Q2, and the two diode drops of diodes 15 and 17. This four diode drop is a high enough voltage to turn on the emitter follower Q3 and conduct current into the base of transistor Q4 and saturate transistor Q4. With transistor Q4 saturated, transistor Q6 is turned off as in a standard TTL gate, and thus current sinking transistor Q9 is turned off and current sourcing transistors Q7 and Q8 are turned on, and there is a high voltage or one logic output on output terminal 11. Therefore, with a zero or low current on the input 10, there is a high or one on the output 11 of this inverting circuit.

The unique feature of the input disable gate 13, one example of which is shown in FIG. 2, is that its output at the collector of transistor 21 is clamped at $1V_{BE}$ rather than going to $V_{CESAT}$. Such a clamp is accomplished by using a second emitter 22 on the phase splitter transistor 23 and tying this second emitter to the output of gate 13 such that the output voltage, when transistors 23 and 21 are on, consists of $V_{BE}$ of transistor 21 plus $V_{BE}$ of transistor 23 through emitter 22 ending up with essentially $1V_{BE}$. Therefore the low output at gate 12 is $1V_{BE}$.

Now by applying an input current at input terminal 10, this current first supplies all of the current that current sink transistor Q1 is going to demand; prior to that a current was flowing down through diode 15 into transistor Q1 with some of it flowing into the base of input transistor Q2. When the current is applied to the input terminal 10, what essentially occurs is that the current coming from diode 15 is replaced by the input current into the collector of transistor Q1. With all the input current demand supplied to current sinking transistor Q1, then a small additional current will flow into the base of input transistor Q2, note that in this state the base drive (current) of Q2 is not supplied by resistor 16 but rather by the input current. Consequently Q2 is turned on and saturates. The collector of transistor Q2 drops down close to the emitter of transistor Q2 and then the voltage on the base of transistor Q3 is going to be approximately ($V_{BE} + V_{SAT} +$ a diode drop) or (two diode drops $+ V_{SAT}$), as distinguished from the above described four diode drops when no input current was applied. This voltage swing at the base of transistor Q3 is thus $4V_{BE}$ when high and $2V_{BE} + V_{SAT}$ when low. This $2V_{BE} + V_{SAT}$ voltage diode drop is not a high enough voltage to turn on transistor Q4 since its base voltage drops to approximately a $V_{SAT}$.

With the output of the output disable gate 12 high, no current flows down the emitter of transistor Q5 and the resistor 18 connected to the base of transistor Q5 will provide base drive into the base of transistor Q6, turning on transistors Q6 and Q9 which pulls down the output terminal 11 as in standard TTL gating and gives a low on the output terminal 11. Therefore, when the current IN on input 10 is greater than the current threshold set by transistor Q1, the output at 11 is going to be low.

The operation described to this point is one where the sensing circuit is active and is sensing high and low input and translating them to low and high outputs, respectively. Now, in normal operation, the output 11 of this circuit will be tied to a tri-state bus line which will communicate with many other devices. As described in the prior art including U.S. Pat. No. 3,792,292 cited above, it is very desirable at times to disconnect this circuit from the bus line by means of the output disable gate 12. This is accomplished by placing a high on the input of the disable gate to turn on this gate and obtain a low on its output. This pulls down the emitter of transistor Q5 and through diode 19 turns both transistors Q7 and Q8 off and turns both transistors Q6 and Q9 off, leaving the output terminal 11 at neither a high state nor a low state, but rather in a high impedance state. The pull up switches Q7 and Q8 and the pull down switch Q9 are thus disabled and unresponsive to any signals on the input terminal 10. The output on terminal 11 can thus assume one of three different states, i.e., high, low, and high impedance, depending on circuit conditions.

The output of disable gate 12 also drives the input disable gate 13 and, when the output of gate 12 goes down to place the output at terminal 11 in the high impedance state, the inverter 13 is turned off, and this opens up the current path of the emitter of transistor Q2 to ground. Transistor Q2 turns off, i.e., acts like an open switch, and the input at terminal 10 is not clamped. In addition, the output disable gate when in the low state (at its output) will turn off the current generator 14 causing Q1 to turn off as well. Before transistor Q2 was turned off, the voltage on the input was clamped; this consisted of the low impedance of the base emitter diode of transistor Q2 and the clamped voltage on the output of the input disable gate 13, i.e., the $V_{BE}$ equivalent voltage on the output of gate 13. In the unclamped state, the input at terminal 10 is forced to a high impedance state and thus allowed to float up and down in dependance on what the MOS on the input is doing at the time.

The reason for this floating capability at the input terminal 10 can best be illustrated by referring to one of many typical applications of this sense amplifier shown in FIG. 3. There is shown an input data bus line 31 utilized by both MOS and bipolar devices. Two MOS devices are illustrated as blocks 32 and 33 and two bipolar devices are shown as gates 34 and 35. This application illustrates input and output capabilities for the MOS devices and output capabilities for the bipolar devices. The sense amplifier circuit of the present invention, also a bipolar device is shown by the block 36 which has its input 10 coupled to the input data bus line 37 which is normally bipolar only.

In certain applications, where interfacing from a MOS bus line 31 to a TTL bus line 37, the voltages on the MOS bus 31 can be clamped to the two $V_{BE}$ diode drops discussed above and the advantage of such voltage clamping at the input of the sense amplifier 36 is that parasitic capacitances do not have to be charged and discharged by the high impedance MOS outputs. Therefore the access time is speeded up.

In the present sense amplifier, when it is desired that two MOS devices communicate with each other over the input data bus 31, the bus 31 must be allowed to float up and down in accordance with the logic states of the sending MOS device and the receiving MOS device to sense that voltage. Thus the desire to unclamp the input of the sense amplifier 36. The novel tri-state input control circuit of FIG. 1 permits the input to be unclamped and allows MOS device to sense other MOS devices on the bus line 31.

On the other hand, when a MOS device is communicating with a bipolar device, the input of the sense amplifier 36 is clamped and the MOS information is simply transferred as high, low data from MOS to TTL. In such case, there is a clamped input data bus line 31 to a high speed operation since capacitances at the bus line do not slow the circuitry down.

Certain advantages are obtained with the improved sense amplifier of the present invention. The speed is substantially improved by using current sensing inputs. The input voltage is clamped thereby neutralizing the MOS output and interconnect line capacitances. The input impedance is reduced in the above embodiment of two diodes, one diode for the embodiment described below in FIG. 5, which enhances the discharge rate of the line's capacitance required for the small voltage change that occurs with a change in current. The noise immunity is improved by permitting the designer to program the threshold current. The correct setting of the threshold is a function of the noise level in the system and the minimum current from the MOS output plus leakage from any tri-state input buffer. By setting the input threshold just above the noise level the speed can be enhanced. Similarly, if the printed circuit board is extremely noisy, or if speed is not too critical, the threshold can be raised and thus gain more noise immunity.

This current sensing device is economical relative to prior devices, which eliminates the need for a resistor per input. Such resistors are used by voltage sensing devices to reduce the input impedance and discharge the line capacitance. Also, several current sensors, for example six, can be offered in a single IC package.

The current sensing amplifier of FIG. 1 is of the inverting type; a non-inverting circuit version is shown in FIG. 4. Components in FIG. 4 similar to those components in FIG. 1 bear the same reference numerals. The operation is the same as that described above for FIG. 1 except that when the input on terminal 10 is low, and the emitter follower Q3 is turned on, transistor Q6 is turned on, turning on current sinking transistor Q9. Transistors Q7 and Q8 are turned off and there is a low output on output terminal 11. On the other hand, with a high input on terminal 10, transistors Q3 and Q6 are turned off, and transistors Q7 and Q8 are turned on and there is a high output on terminal 11.

Referring now to FIG. 5 there is shown an embodiment of this invention similar to that of FIG. 1 except that the tri-state input capability has not been incorporated. Similarly functioning components of FIG. 5 bear the same reference numerals as those components of FIG. 1.

In FIG. 5 the input is always clamped to the $1V_{BE}$ of input transistor Q2. As before, the current is set at the current sink transistor Q1 from the current generator 14. When the input current at terminal 10 is off, some current flows via diode 17 into the collector of transistor Q2 and transistor Q2 is on but not saturated; its output voltage is clamped to two diodes. This diode drop is high enough to turn on the emitter follower transistor Q3, conducting current into the base of transistor Q4 which saturates. Transistor Q6 is turned off and transistor Q9 is turned off while transistors Q7 and Q8 are turned on, and there is a high or one logic on output terminal 11.

When the input current at terminal 10 is greater than the threshold set as Q1 collector current, the additional flow into the base of input transistor Q2 and it saturates. As before, the emitter follower transistor Q3 turns off, and transistor Q4 also turns off. When the output disable gate is off, no current flows down the emitter of transistor Q5 and the resistor 18 connected to the base of transistor Q5 provides base drive into the base of transistor Q6. Transistors Q6 and Q9 are turned on to pull down the output at terminal 11 to a low. As explained above, the disable gate 12 can be utilized to control the output to give a tri-state condition at the output.

What is claimed is:

1. A logic circuit comprising:
 a signal receiving input means comprising an input transistor adapted to be coupled to an input data bus,
 an output terminal adapted to be coupled to a driven logic circuit,
 an output sourcing switch coupled to said output terminal for operating at times to couple a first voltage source to said output terminal,
 an output sinking switch coupled to said output terminal for operating at times to couple a second voltage source to said output terminal,
 switching means coupled to said signal receiving input means and to said sourcing and sinking switches for selectively switching said two switches in response to the application of one or the other of two signals to said signal receiving input means from said input data bus to provide a coupling of said first or second voltage sources to said output terminal, and
 a current controlled means coupled to said input transistor for controlling the threshold at which said input transistor will operate to produce a switching of said switching means.

2. A logic circuit as claimed in claim 1 wherein said current controlled means comprises a current sinking transistor coupled to said input transistor for controlling the current flow through said input transistor.

3. A logic circuit as claimed in claim 2 including means coupled to said signal receiving input means for disabling said input means to permit the voltage at said input data bus to float relative to said input means, thereby providing tri-state capability at said input means.

4. A logic circuit as claimed in claim 3 wherein said disabling means comprises a disabling gate for disabling said input transistor.

5. A logic circuit as claimed in claim 2 wherein said current sinking transistor comprises a base, emitter and collector,
 a current generator coupled to the base of said current sinking transistor for controlling the current therethrough,
 said input transistor having a base, emitter and collector, said latter base adapted to be coupled to said input data bus and coupled to the emitter-collector circuit of said current sinking transistor, whereby the current through the emitter-collector circuit of said input transistor is controlled by both said current sinking transistor and the input of said input data bus.

6. A logic circuit as claimed in claim 5 including means coupled to said signal receiving input means for disabling said input means to permit the voltage at said input data bus to float relative to said input means.

7. A logic circuit as claimed in claim 6 wherein said disabling means comprises a disabling gate for disabling said input transistor.

8. A logic circuit as claimed in claim 2 wherein said switching means comprises a switching transistor including a base coupled to said input transistor and switchable from one state to another dependent on the voltage on said base, said input transistor operating in response to the current in said current sinking transistor to establish the voltage level on the base of said switching transistor.

9. A logic circuit as claimed in claim 8 wherein the current sinking transistor comprises a base, emitter and collector,
 a current generator coupled to the base of said current sinking transistor for controlling the current therethrough,
 said input transistor having a base, emitter and collector, said latter base adapted to be coupled to said input data bus and coupled to the emitter-collector circuit of said current sinking transistor, whereby the current through the emitter-collector circuit of said input transistor is controlled by both said current sinking transistor and the input on said input data bus,
 said switching transistor being coupled to said emitter-collector circuit of said input transistor.

10. A logic circuit as claimed in claim 1 including a disabling means coupled to said switching means for disabling both said sourcing and sinking switches to produce a high impedance state at said output terminal, thereby providing tri-state capability at said output terminal.

11. A logic circuit as claimed in claim 10 including a disabling means coupled to said signal receiving input means for disabling said input means to permit the voltage at said input data to float relative to said input means, thereby providing tri-state capability at said input means.

12. A logic circuit as claimed in claim 11 wherein said current controlled means comprises a current sinking transistor coupled to said input transistor for controlling the current flow through said input transistor.

13. A logic circuit as claimed in claim 12 wherein said disabling means coupled to said signal receiving input means comprises a disabling gate for disabling said input transistor.

14. A logic circuit as claimed in claim 1 including means coupled to said signal receiving input means for disabling said input means to permit the voltage at said input data bus to float relative to said input means, thereby providing tri-state capability at said input means.

15. A logic circuit as claimed in claim 14 wherein said disabling means comprises a disabling gate for disabling said input transistor.

16. A logic circuit as claimed in claim 14 including a disabling means coupled to said switching means for disabling both said sourcing and sinking switches to produce a high impedance state at said output terminal, thereby providing tri-state capability at said output terminal.

* * * * *